(12) United States Patent
Rosen

(10) Patent No.: US 6,449,327 B1
(45) Date of Patent: Sep. 10, 2002

(54) COUNTER CIRCUIT

(75) Inventor: Eitan Emanuel Rosen, Abirim (IL)

(73) Assignee: Intel Corp., Santa Clara, CA (US)

( * ) Notice: Subject to any disclaimer, the term of this patent is extended or adjusted under 35 U.S.C. 154(b) by 0 days.

(21) Appl. No.: 09/753,765

(22) Filed: Dec. 29, 2000

(51) Int. Cl.[7] .............................................. H03K 21/00
(52) U.S. Cl. .............................. 377/33; 377/51; 377/56
(58) Field of Search ............................... 377/33, 51, 56

(56) References Cited

U.S. PATENT DOCUMENTS 6,269,138 B1 * 7/2001 Hansson ..................... 377/26

*Primary Examiner*—Margaret R. Wambach
(74) *Attorney, Agent, or Firm*—Kenyon & Kenyon

(57) ABSTRACT

A system and method are presented for providing a multi-stage counter. In one embodiment, a signal propagates from the most significant bit of the counter to the least significant bit of the counter that indicates that all "more significant" stages of the counter have reached a limit value (e.g., all 1's). Use of this propagating signal means that only the first (or first couple) stages of the counter are time critical, while the remainder are less so. The described counter may have a modular design and may result in lower power consumption.

18 Claims, 1 Drawing Sheet

COUNTER CIRCUIT

BACKGROUND OF THE INVENTION

The present invention relates to a counter circuit. More particularly, the present invention pertains to an improved counter circuit that may be operated at faster frequencies and reduce power consumption.

Counter circuits are generally known in the art. A counter typically includes a number of identical stages where each stage outputs one binary digit of the count. For example, a 10 bit ripple counter is able to count from binary 0 to binary 1023 and includes 10 identical stages. The 10-bit ripple counter, as a whole, will include one input for a clocking signal so that the counter will increment or decrement by one binary digit for each period of the clocking signal. For example, the counter may increment/decrement on each falling edge of the clocking signal. For an incrementing ripple counter, the first stage receives a clocking input, which is provided to the clock input of a J-K flip-flop while the J and K inputs are tied to a high voltage (i.e., binary "1") value. When the clocking signal reaches a falling edge, the first JK flip-flop would transition from a "0" value to a "1" value if this "stage" has been cleared prior to operation. The output of the first J-K flip-flop is the least significant bit (LSB) of the counter and is supplied as the clocking input of the second J-K flip-flop. On the next clocking signal, the output of the first flip-flop will drop to "0" and will cause the output of the second J-K flip-flop to rise to a "1" value if this stage has been cleared prior to operation. In a 10 bit ripple counter, there would be 10 such J-K flip-flops coupled in much the same manner. The output of the tenth J-K flip-flop would be the most significant bit (MSB) and the 10 outputs of the 10 J-K flip-flops will represent the number of falling edges of the clocking signal received by the first J-K flip-flop.

Problems seen with a counter of this type concern how this counter reaches its final value and is reset to its initial value. To determine if the counter has reached its final value a string of AND gates are typically used, for example, to compare the output bit for each stage to the value "1." Once all of the stages have been set to "1" in this example, the stages must then be reset to an initial value. The more stages included in the counter, the longer these two steps take. If the counter is being used in a divider circuit (e.g., to convert a clocking signal into one have a lower frequency), the resetting of all of the stages must occur during one period of the original clocking signal. As clocking signals become faster and faster, such procedures become more difficult. Furthermore, the toggling of signals at the outputs of comparators (e.g., AND gates) and counter stages may make the counter power inefficient.

DETAILED DESCRIPTION

Figure 1:
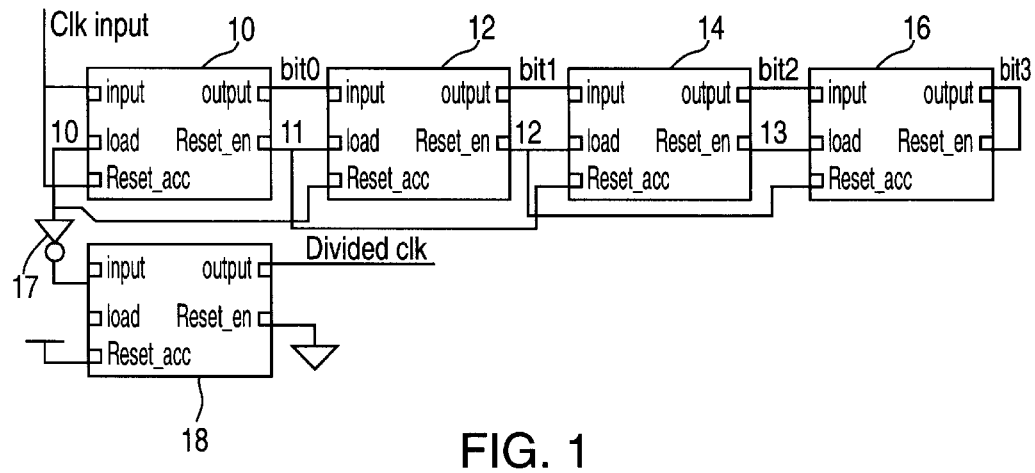
FIG. 1 is a block diagram of a counter circuit constructed according to an embodiment of the present invention.

Referring to FIG. 1, a block diagram of a counter circuit is shown. For this example, the counter is designed to count from an initial value state to an all 1's value and repeatedly do so. In FIG. 1, the counter is used to divide the clocking signal input into a slower frequency. In this embodiment, a first stage 10 includes several inputs: a clock input (labeled "input" in FIG. 1), a reset input (reset acknowledge, labeled "reset_acc" in FIG. 1), and a reset enable input (labeled "reset_en" in FIG. 1). The first stage 10 also includes at least two outputs: a stage output (labeled "output" in FIG. 1), and a load output. A clock input (Clk input) is provided to the input and reset of the first stage 10. The output of the first stage is coupled to the input of the second stage 12. The load output of the second stage ("11") is suppled to the reset enable input of the first stage and the rest input of the third stage. The coupling of the second stage 12 is similar to the coupling of the third stage 14 and fourth stage 16. In the fourth stage 16k, the output is coupled back into the reset enable input of the stage.

Figure 2:
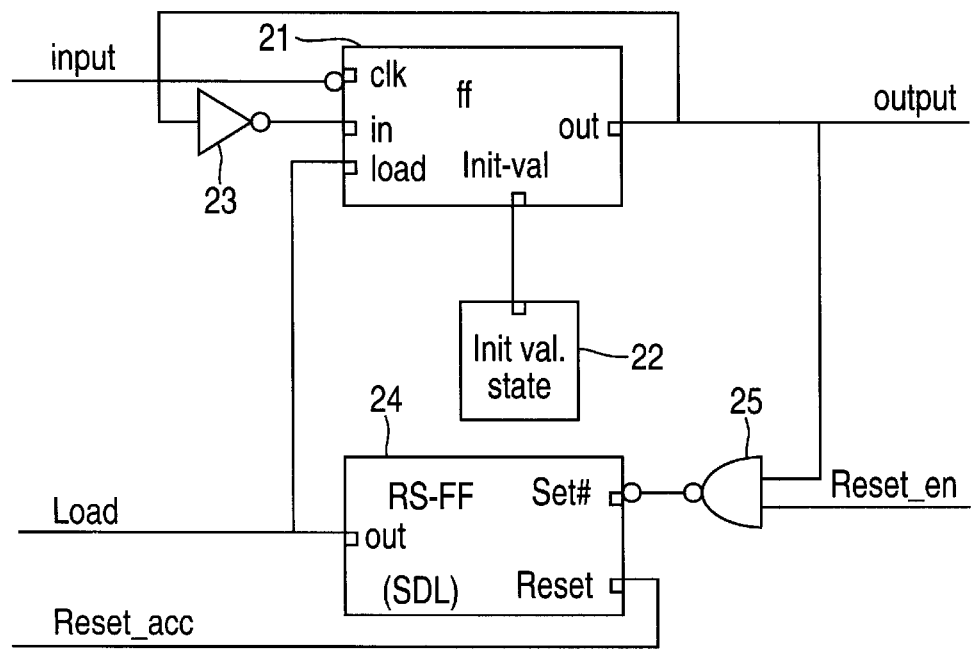
FIG. 2 is a more detailed block diagram of a single stage of the circuit of FIG. 1.

Referring to FIG. 2, a more detailed example of a stage in FIG. 1 is shown. For example, if this is the first stage 10 fro FIG. 1, the clock input is provided as an inverted input to the clock of a D-type flip-flop 21. An initial value (e.g., 0) may be provided as stored in a memory device 22 such as a register or the like. An initial value of 0 will cause the output ("out") of this first flip-flop 21 to be 0 as well. The output is not only provided to the next stage, but is also provided to an inverter 23 and back to a data input ("in") of the flip-flop 21. In addition to the D-type flip-flop, an RS (Reset-Set) flip-flop 24 is provided. In this embodiment of the present invention, RS flip-flop 24 is a Set Dominant Latch (SDL) where when Set and Reset are asserted, the Set input takes precedence. The Set# input ("#" indicates a negative assertion) is coupled to the output of a NAND gate 25, which receives as inputs, the reset enable signal from the subsequent stage and the output of flip-flop 21. The Reset input is coupled to the reset_acc signal. The output of the R-S flip-flop 24 provides the load signal for flip-flop 21 and the "Load" signal, which is used to immediately load the flip-flop 21 with the initial value loaded in memory device 22.

The operation of the circuits of FIGS. 1 and 2 can best be shown by way of example. In this example, it is assumed that the initial value for the counter is 0000. The output of each flip-flip 21 will be 0 and will show up as 0's for the signal lines labeled "bit0," "bit1," "bit2," and "bit3" in FIG. 1. The 0 output by the flip-flop is inverted to a 1 by inverter 23 and supplied to the input of the flip-flop 21. The 0 output by the flip-flop is also supplied to NAND gate 25. This ensures that the output of NAND gate 25 will be a 1 preventing RS flip-flop 24 from setting itself. The output of RS flip-flop 24 will be a 0, which is supplied to the load input of flip-flop 21. Thus in this initial stage, the RS flip-flop is in a reset state and the flip-flop 21 has a 0 output and a 1 input, awaiting the next clocking signal. If the stage in FIG. 2 is the first stage, the falling edge of the Clk input signal causes the output of flip-flop 21 to become a 1 (and inverted b inverter 23 before being supplied as a 0 to the input of flip-flop 21). With a 1 output, the bit0 signal becomes a 1. The 1 value is also NANDed with the reset enable signal at NAND gate 25. Looking at FIG. 2, the reset enable signal is supplied as the output ("load") of the RS flip-flop of the subsequent stage. Because bit1 is 0 at this point, the load output of the second stage 12 will be 0, so the RS flip-flop 24 in the first stage will remain in a reset state.

At this point the counter reads 0001 with bit0 being the only bit set. On the next Clk input signal, the output of flip-flop 21 changes to a 0 value due to the 0 value at its input. The input changes to 1 because of inverter 23. Again, the 0 output at NAND gate 25 ensures that the RS flip-flop 24 will remain in a reset state. In the second stage, the input signal drops to a 0 value causing the output of the flip-flop to rise to a 1 value. At this point, the counter reads 0010 with bit1 being the only bit set. The RS flip-flop 24 in each stage remains in the reset state. The counter will continue to operate in this fashion through the counter reaching 1000.

When the counter reaches 1000, the output "bit3" is a one value and is suppled to the reset enable input of the fourth stage 16. As seen in FIG. 2, the output of the flip-flop 21 and the reset enable signal are both 1 causing the output of NAND gate 25 to be a 0 value. This causes the Set# input of the RS flip-flop to be asserted. Since the "load" output of the third stage 14 is 0 at this point, the output of the RS flip-flop 24 goes to a 1 value. The load input of the flip-flop 21 also is set to a 1 causing the initial value to be loaded into the flip-flop 21. The flip-flop 21 cannot change state while the "load" signal is still set. The "load" output of the fourth stage 16 indicates that the most significant bit of the counter is set to a 1. The first, second, and third stages 10, 12, 14, continue as described previously until the counter reaches 1100.

At 1100, the output of the flip-flop 21 in the third stage 14 goes to a 1 value and the reset enable signal ("13" in FIG. 1) is at a 1 value because the RS flip-flop 24 in the fourth stage is in a set state. As with the fourth stage, the RS flip-flop 24 is set in the third stage. Thus, the Load output for any stage indicates that that stage and any "more significant" bits in the counter are set. In other words, each less significant stage has an input indicating that the more significant stages have reached a limit value (e.g., all 1's or all 0's). Referring to FIG. 1, when the counter reaches 1111, the load output of the first stage 10 ("10") is a 1 value. In this embodiment, the load output is supplied to inverter 17 and to the input of an additional stage 18. With the Reset input set to a 1 value and the reset enable input set to a 0 value, the output will be another clocking signal with a lower clock frequency having a period equal to the number of clocking signals from the initial value to all 1's.

When the load signal of the first stage 10 is set, that value is suppled to the reset input of the second stage 12, which causes the load output of the RS flip-flop 24 for that stage to reset. As seen in FIG. 1, as each RS flip-flop is reset it causes its load output to be deasserted and supplied to the RS flip-flop of the next stage. In stage 1, the load signal resets the first stage allowing it to start counting from its initial value. Thus, the counter starts its count from the initial value while the remaining stages are reset to their initial values so that they can participate in the counter.

The counter of the present invention has several advantages. First, the clocking signal need only be supplied to the first stage 10, which result in lower power consumption when compared to supplying the clocking signal to all stages. Second, the counter provides a "done" signal in that the "load" signal provided by each stage indicates that that particular stage will no longer need to change its output. Third, the counter makes this "done" signal and a "load initial state" modular and non critical. Thus, the counter of the present invention may be very modular in that the design of a 4-bit counter and a 10-bit counter are very similar (six identical stages may be added to the four-bit counter described above). Moreover, the procedure for checking if the counter has reached its final value may be done continuously throughout the count on a stage-by-stage basis (from the MSB to the LSB) and the resetting of the counter may also be done on a stage-by-stage basis. This means that the first stage would be the only "time-critical" stage (i.e., the stage that need to be checked and reset within any time constraints caused by the frequency of the clocking signal); remaining stages have a greater amount of time to be reset to participate in the count.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A counter circuit comprising:
    a plurality of stages wherein each stage has an output indicating a bit of said counter circuit, wherein a first one of said stages has a first input indicating that stages indicating more significant bits of said counter circuit have reached a limit value.

2. The counter of claim 1 wherein each stage has an initial value input.

3. The counter of claim 2 wherein each stage is to output a load signal when said stage and each stage indicating a more significant bit of said counter circuit has reached a limit value.

4. The counter of claim 3 wherein each stage loads its initial value input when outputting said load signal.

5. A counter circuit comprising:
    a plurality of stages, each stage including:
        a first flip-flop having a load input;
        an RS flip-flop having an output coupled to the load input of said first flip-flop,
    said RS flip-flop to generate a load signal when the stage and stages indicating more significant bits of said counter circuit have reached a limit value.

6. The counter circuit of claim 5 wherein said first flip-flop further includes a clock input, a data input, and an initial value input and an output.

7. The counter circuit of claim 6 wherein the output of the first flip-flop of a first one of said plurality of stages is coupled to the clock input of the first flip-flop of a second one of said plurality of stages.

8. The counter circuit of claim 7 wherein each stage further includes a reset enable input coupled to a set input of said RS flip-flop.

9. The counter circuit of claim 8 wherein the reset enable input of the first stage is coupled to the load output of the second stage.

10. The counter circuit of claim 9 wherein each stage further comprises a NAND gate having an output coupled to the set input of said RS flip-flop, a first input coupled to the output of said first flip-flop and the reset enable input of said stage.

11. The counter circuit of claim 10 wherein each stage further includes a reset input coupled to said RS flip-flop such that when each stage receives a reset signal, an initial value is loaded into said first flip-flop.

12. The counter circuit of claim 11 wherein said reset signal is received at each stage after the counter circuit has reached said limit value.

13. The counter circuit of claim 5 wherein a clocking signal is supplied to the clock input of the first flip-flop of the first stage.

14. The counter circuit of claim 13 further comprising:

an additional stage coupled to said first stage, wherein the load output of said first stage is coupled to a data input of said additional stage such that said additional stage is to output a divided clock signal based on receipt of a load signal from said first stage.

15. A method for generating a divided clocking signal comprising:

providing a clocking signal to a first stage of a plurality of stages of a counter circuit;

receiving a load signal at one of said plurality of stages indicating that stages indicating more significant bits of said counter circuit have reached a limit value.

16. The method of claim 15 further comprising:

outputting a load signal at said first stage when each of said plurality of stages has reached a limit value.

17. The method of claim 16 further comprising:

generating a divided clock signal at an additional stage based on the load signal from the first stage of said plurality of stages.

18. The method of claim 16 wherein each of plurality of stages is to output a load signal, the method further comprising:

loading an initial value into each of said plurality of stages after each of said plurality of stages has generated a load signal.

* * * * *